: US 9,316,990 B2
(45) Date of Patent: Apr. 19, 2016

(54) MOTHERBOARD MOUNTING STRUCTURE, IMAGE FORMING APPARATUS AND METHOD FOR PERFORMING THE SAME

(71) Applicants: Kazuhiro Takabayashi, Tokyo (JP); Kohta Takenaka, Kanagawa (JP)

(72) Inventors: Kazuhiro Takabayashi, Tokyo (JP); Kohta Takenaka, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 382 days.

(21) Appl. No.: 13/760,582

(22) Filed: Feb. 6, 2013

(65) Prior Publication Data

US 2013/0236210 A1 Sep. 12, 2013

(30) Foreign Application Priority Data

Mar. 9, 2012 (JP) ................................. 2012-052726

(51) Int. Cl.
| | |
|---|---|
| *H05K 1/11* | (2006.01) |
| *H05K 1/14* | (2006.01) |
| *G03G 15/00* | (2006.01) |
| *H05K 7/02* | (2006.01) |
| *H05K 3/00* | (2006.01) |
| *G03G 21/16* | (2006.01) |

(52) U.S. Cl.
CPC ............ *G03G 15/80* (2013.01); *G03G 21/1652* (2013.01); *H05K 3/00* (2013.01); *H05K 7/02* (2013.01); *Y10T 29/49124* (2015.01)

(58) Field of Classification Search
USPC .......................... 361/788, 796–803, 752–753
See application file for complete search history.

(56) References Cited

U.S. PATENT DOCUMENTS

| 5,988,781 | A | 11/1999 | Shimada et al. |
| 6,388,895 | B1 * | 5/2002 | Hsu ................................ 361/829 |
| 6,411,520 | B1 * | 6/2002 | Hauke et al. ................... 361/796 |
| 6,496,376 | B1 * | 12/2002 | Plunkett et al. ................ 361/729 |
| 2005/0111795 | A1 * | 5/2005 | Gherardini ...................... 385/55 |

FOREIGN PATENT DOCUMENTS

| JP | H7251548 A | 10/1995 |
| JP | 2002-246773 | 8/2002 |
| JP | 2004219663 A | 8/2004 |
| JP | 2009151034 A | 7/2009 |

OTHER PUBLICATIONS

Japan Patent Office Communication with the dispatch No. 548250 dated Dec. 4, 2015 for Japanese Patent Application No. 2012-052726.

* cited by examiner

*Primary Examiner* — Tuan T Dinh
(74) *Attorney, Agent, or Firm* — Harness, Dickey & Pierce, P.L.C.

(57) ABSTRACT

A motherboard mounting structure includes a first board having a first connector and a second board having a second connector electrically connected directly to the first connector of the first board. The second board includes an external terminal connectable to an external device. The external terminal is inserted (or extracted) through an external terminal insertion opening formed on an orthogonal surface of a mainframe orthogonal to a surface of the second board. A mounting board is provided and to which the first and second boards are attached. The second board is attached to the mounting board with the external terminal protruding from the external terminal insertion opening. The first and second boards are slidably attached in a prescribed direction to separate from the orthogonal surface of the mainframe.

17 Claims, 7 Drawing Sheets

FIG. 10

MOTHERBOARD MOUNTING STRUCTURE, IMAGE FORMING APPARATUS AND METHOD FOR PERFORMING THE SAME

CROSS-REFERENCE TO RELATED APPLICATION

This patent application is based on and claims priority pursuant to 35 U.S.C. §119 to Japanese Patent Application No. 2012-052726, filed on Mar. 9, 2012 in the Japanese Patent Office, the entire disclosure of which is hereby incorporated by reference herein.

BACKGROUND

1. Field

The present invention relates to a motherboard mounting structure and an image forming apparatus with the motherboard mounting structure.

2. Related Art

An image forming apparatus, such as a copier, a printer, a facsimile machine, etc., has a motherboard that generally controls an image forming apparatus and a control board having one or more external terminals that connect to an external device, such as a personal computer, etc. The motherboard and the control board are electrically connected by directly plugging a connector of the control board in a connector of the motherboard bypassing a harness or the like. The control board is secured to a mainframe of the image forming apparatus serving as a mounting board with its external terminals protruding toward an exterior of the image forming apparatus.

Further, an expansion terminal is sometimes provided in the control board for connecting an expansion unit to enhance the functionality of the image forming apparatus. For example, an HDD that stores image data or the like may be connected to expand memory capacity of the apparatus.

When the expansion unit is to be connected, the control board needs to be removed from the image forming apparatus. Therefore, the connector of the control board needs to be extracted from the connector of the motherboard. According to one example as disclosed in Japanese Patent No. JP-4091747-B (JP-2002-246773-A), an opening is formed in the surface of a mainframe of an image forming apparatus perpendicular to a surface the control board (hereinafter referred to as an orthogonal surface of the mainframe of the image forming apparatus) to allow removal of the control board from the mainframe of the image forming apparatus. Therefore, the control board is attached to a bracket slidably disposed in the mainframe of the image forming apparatus, which bracket has a cover plate that blocks the opening in the orthogonal surface of the mainframe. In this bracket, an expansion unit mount is provided to accommodate the expansion unit.

When the expansion unit, such as an HDD, etc., is added, the bracket is slid and moved to extract the control board from the opening in the orthogonal surface. Then, the connector of the control board and the connector of the motherboard are separated from each other, and the control board is after that removed from the opening in the orthogonal surface together with the bracket to an exterior of the image forming apparatus.

Subsequently, the expansion unit is attached to the expansion unit mount of the bracket and is then connected to the expansion terminal provided on the control board using a harness. When the expansion unit is connected to the expansion terminal in this way, the bracket is inserted through the opening in the orthogonal surface together with the expansion unit and the control board.

When the bracket is inserted from the opening in the orthogonal surface into the mainframe of the image forming apparatus, the connector of the control board attached to the bracket is plugged into the connector of the motherboard. At the same time, the cover plate blocks the above-described opening in the orthogonal surface. With this, the installation of the control board into the mainframe of the image forming apparatus is completed, so that the expansion unit is added.

However, in such a conventional configuration, the opening in the orthogonal surface becomes relatively large in order to enable the control board to be extracted from the mainframe of the image forming apparatus, thereby compromising the structural integrity of the image forming apparatus mainframe. Further, since the cover plate is needed in the control board to block the opening in the orthogonal surface, the number of components, and accordingly the device cost increase as a result.

SUMMARY

Accordingly, the present invention provides a novel parts-mounted board structure that includes a first board at least having a first connector and a second board having a second connector electrically connected directly to the first connector of the first board. The second board includes an external terminal connectable to an external device. The external terminal is inserted through an external terminal insertion opening formed on an orthogonal surface of a mainframe orthogonal to a surface of the second board. A mounting board is provided to which the first and second boards are attached. The second board is attached to the mounting board with the external terminal protruding from the external terminal insertion opening. The first and second boards are slidably attached in a prescribed direction to separate from the orthogonal surface of the mainframe.

In another aspect of the present invention, a first bracket is provided to hold the first board. A second bracket is also provided to hold the second board. A first guiding hole is formed on one of the first bracket and the mounting board to extend perpendicular to the orthogonal surface of the mainframe of the image forming apparatus. A first guiding projection is formed on the other one of the first bracket and the mounting board to be inserted into the first guiding hole. A second guiding hole is formed on one of the second bracket and the mounting board to extend perpendicular to the orthogonal surface of the mainframe of the image forming apparatus. A second guiding projection is also formed on the other one of the second bracket and the mounting board to be inserted into the second guiding hole.

In yet another aspect of the present invention, the mounting board is a plate member extending perpendicular to a horizontal plane. A hook is disposed on a tip of the guiding projection extending perpendicular to the orthogonal surface of the mainframe of the image forming apparatus to hook onto the mounting board.

In yet another aspect of the present invention, the second board includes an expansion terminal connected to an expansion unit to enhance the functionality of an internal device. The second bracket includes an expansion unit mounting section, to which the expansion unit is attached.

In yet another aspect of the present invention, a connector guide is provided to guide the first connector of the first board to the second connector of the second board when the first connector of the first board is connected to the second connector of the second board.

In yet another aspect of the present invention, the connector guide guides the first connector of the first board to the second connector of the second board before the first connector of the first board contacts the second connector of the second board.

In yet another aspect of the present invention, the second board is attached to the mounting board with a screw.

In yet another aspect of the present invention, an image forming apparatus includes an image formation device to form an image on a recording medium and the above-described parts-mounted board with multiple parts-mounted boards mounted thereon.

BRIEF DESCRIPTION OF THE DRAWINGS

A more complete appreciation of the present invention and many of the attendant advantages thereof will be more readily obtained as substantially the same becomes better understood by reference to the following detailed description when considered in connection with the accompanying drawings, wherein.

DETAILED DESCRIPTION

Figure 1:
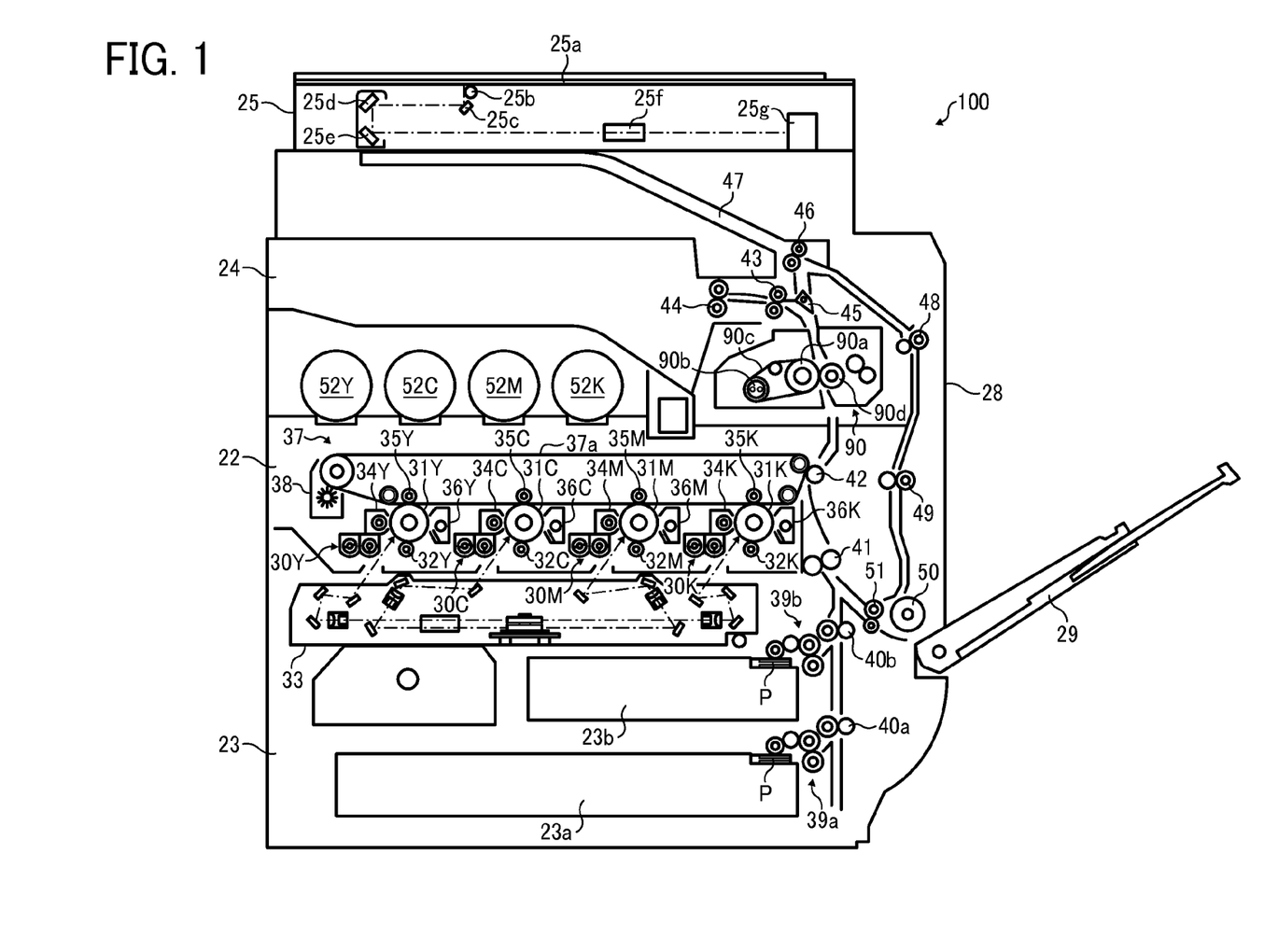
FIG. 1 is a schematic configuration of a copier as an image forming apparatus according to one embodiment of the present invention.

Referring now to the drawings, wherein like reference numerals designate identical or corresponding parts throughout the several views thereof and in particular to FIG. 1, a copier employing an electrophotography system (hereinafter simply referred to as a copier machine 100) is described as one exemplary embodiment of an image forming apparatus, to which the present invention is applied. As show there, the image forming apparatus of this embodiment is the copier machine 100 with a document scanning unit and an image formation unit. However, the copy machine 100 can be used as a printer, a scanner, and a facsimile machine by connecting with a LAN (Local Area Network) cable or a telephone line.

In the copy machine 100, a printer unit 22 is placed at a center of the mainframe as an image formation unit, while a two-step feeder unit 23 is located right under the printer unit 22. Further, a sheet ejection unit 24 of a so called built-in type is provided above the printer unit 22. Beside, a scanner unit 25 is disposed above the sheet ejection unit 24 as a document reader.

The scanner part 25 located above the printer unit 22 includes a platen glass 25a as a document table on which a document is placed and a light source 25b that illuminates the document or the like. Further, first to third mirrors 25c, 25d, and 25e, etc., are provided to reflect light reflected from the document. An image sensor 25g to read an image of a document as a reader means, such as a CCD (Charge Coupled Device), etc., and an imaging lens 25f imaging the reflected light from the document placed at an imaging position are provided. Above the scanner unit 25, there are provided a pressing cover that presses the document against the platen glass 25a and an automatic document feeder (ADF), not shown, that automatically feeds the document to the platen glass 25a.

The printer unit 22 is disposed at a center of the copy machine 100 and includes four image forming units 30 Y, 30M, 30C, and 30K to form images of respective colors of cyan (C), magenta (M), yellow (Y), and black (K). Above the image forming units 30Y, 30M, 30C, and 30K, an intermediate transfer unit 37 having an intermediate transfer belt 37a as an endless belt type intermediate transfer unit is located. Below the image forming units 33Y 30M, 30C, and 30K, an optical writing device 33 is also disposed.

The image forming units 30Y, 30M, 30C, and 30K have substantially the same configuration with each other and include image carriers as the photoconductive drums 31Y, 31M, 31C, and 31K, respectively. Further, around photoconductors, charging devices 32Y, 32C, 32M, and 32K, developing devices 34Y, 34C, 34M, and 34K, primary transfer rollers 35Y, 35C, 35M, and 35K, and cleaners 36Y, 36C, 36M, and 36K are located, respectively.

The optical writing device 33 is arranged to be used by the four image forming units 30Y, 30M, 30C, and 30K having one deflector at a center, and distributes light flux from four light-beam into four routes therewith thereby providing deflection scanning, and writes latent images on the respective four photoconductive drums 31Y, 31C, 31M, and 31K. Further, the optical writing device 33 is configured from four light sources of a laser diode (LD) type prepared for each color, and a first optical system to collimate the laser beam emitted from the light sources, a polygon mirror (e.g., a rotating polygonal mirror), and a deflector consisting of a polygon motor (e.g., a polygon scanner). The optical writing device 33 is also configured from a second optical system mainly consisting of a scanning and imaging lens, such as an f-θ lens, etc., and a correction lens. Therefore, the laser beam emitted from the laser diode according to each color image information is subjected to the deflection scanning by the polygon scanner, and is irradiated to each of the color photoconductive drums 31Y, 31C, 31M, and 31K.

Further, between the printer unit 22 and the sheet exit unit 24, multiple toner bottles are provided to replenish toner to the developing devices 34Y, 52Y, 52C, 52M, and 52K 34C, 34M, and 34K installed in the image forming units 30Y, 30M, 30C, and 30K, respectively. In toner bottles 52Y, 52C, 52M, and 52K, cyan (C), magenta (M), yellow (Y), and black (K) toner particles are filled in this order from the left in the drawing. From these toner bottles 52Y, 52C, 52M, and 52K, a given replenishment amount of toner of each color is replenished through each conveyance path, not shown, to each of the color developer units 34Y, 34C, 34M, and 34K.

The intermediate transfer belt 37a in the intermediate transfer unit 37 is stretched by driving and driven rollers and a primary transfer roller as well and is thus rotated in a direction as shown by arrow in the drawing. There is provided a secondary transfer roller 42 on the right side of the intermediate transfer belt 37a. Whereas, on the left side of the intermediate transfer belt 37a, there is provided an intermediate transfer belt cleaner 38.

In the sheet feeding device 23 located below the copy machine 100, two-steps of first and second sheet feeding cassettes 23a and 23b are installed to accommodate transfer sheets P as recording media. From one of the sheet feeding cassettes 23a and 23b, a first feeder 39A or a second sheet feeder 39b feeds the transfer sheet P. The transfer sheet P is further fed via either a first or a second conveyance roller 40a or 40b toward a registration roller 41. Further, the transfer sheet P fed to the registration roller 41 is sent out toward a secondary transfer roller 42 at a prescribed time.

Above the secondary transfer roller 42, a fixing unit 90 is disposed. In the fixing unit 90, a fixing belt 90c supported by a fixing roller 90a and a heating roller 90b and a pressure rollers 90d pressing against the fixing belt 90c are provided. Above the fixing unit 90, the transfer roller 43 and the sheet ejection roller 44 are provided to convey and eject the sheet P toward the sheet exit unit 24. Further, yet above the transfer roller 43 and the sheet ejection roller 44, there are provided a switching nail 45 for switching a conveyance path in a double-sided printing mode, a reverse transfer roller 46, and a reversal conveyance path 47 to flip a direction of the sheet P in a switch back manner. A direction of the sheet P temporary stacked on the reversal conveyance path 47 is inverted by the reverse conveyance roller 46, and the sheet P is further transferred through a duplex sheet feeding path by first and second double-side conveyance rollers 48 and 49, and is then fed again toward the registration roller 41.

Now, exemplary operation of the image forming apparatus is described herein below. When a copy is made, the pressing cover is opened and a document is placed on the platen glass 25a in the scanner unit 25. Otherwise, the document is placed on an ADF (i.e., Automatic Document Feeder), not shown. In any way, when the document is placed on the ADF and a start switch is depressed on an operation unit 26, the document set on the ADF is moved onto the platen glass 25a, and the scanner unit 25 is then driven. On the other hand, when the document is set on the platen glass 25a, the scanner unit 25 is driven, immediately. Subsequently, a first carriage that includes a light source 25b and a first mirror and a second carriage that holds second and third millers 25d and 25e are driven. Then, from the light source 25b, light is emitted and reflected by the surface of the document, and the light reflected therefrom is further reflected by the first mirror 25c, and is directed toward the second carriage. The light is then reflected by the second and third mirrors 25d and 25e and enters an image sensor 25g after passing through the imaging lens 25f, so that contents of the document are read by the imaging sensor 25g. When either a prescribed mode or an automatic mode is selected and set through the operation unit 26, image forming operation is started in either a full-color or a black and white mode in accordance with a result of reading the document.

Specifically, in the printer unit 22, the photoconductive drums 31Y, 31C, 31M, and 31K are initially charged uniformly by the charging units 32Y, 32C, 32M, and 32K, respectively. Then, the photoconductive drums 31Y, 31C, 31M, and 31K are scanned and exposed by laser light emitted from the optical writing device 33 having the four light sources, the four routes of the optical scanning systems, and a common deflector, so that electrostatic latent images are created on the respective photoconductive drums 31Y, 31C, 31M, and 31K. Each electrostatic latent image is developed by each of the color developing devices 34Y, 34C, 34M, and 34K and toner images of yellow, cyan, magenta and black are formed in the surfaces of the respective photoconductive drums 31Y, 31C, 31M, and 31K.

Subsequently, a primary transfer voltage is applied to each of the primary transfer rollers 35Y, 35 C, 35M, and 35K, so that toner images on the photoconductive drums 31Y, 31C, 31M, and 31K are transferred one by one onto the intermediate transfer belt 37a. Image formation for respective colors at this time is executed at a different time from upstream to downstream, so that the toner images can be transferred and superimposed at the same position on the intermediate transfer belt 37a.

In synchronism with the primary transfer operations, the transfer sheet P as a recording medium is fed by one of the first and second sheet feeding units 39 and 39b from any one of the first and second transfer sheet feeding cassettes 23a and 23b as the sheet feeding device 23. Otherwise, the transfer sheet P is fed by the sheet feeding roller 50 from the manual sheet insertion table 29. A tip of the transfer sheet P is detected by a sensor, not shown, when it reaches the registration roller 41. The transfer sheet P is conveyed by the registration roller 41 at a prescribed time timed based on a detection signal toward a secondary transfer nip formed between the intermediate transfer belt 37a and the secondary transfer roller 42. The image formed on the intermediate transfer belt 37a is conveyed to the secondary transfer roller 42, and is transferred onto the transfer sheet P at once during a secondary transfer operation. The transfer sheet P with the thus transferred image is then conveyed into the fixing unit 90 and the image is fixed by the heat and pressure. The transfer sheet P is further conveyed to the sheet exit unit 24 by a conveyance roller 43 and is ejected by a sheet exit roller 44. Hence, a color image can be obtained finally on the transfer sheet P.

When the duplex mode is selected through the operation unit 26 and a two-sided copy is to be made, the switching nail 45 switches a conveyance path while the reverse conveyor roller 46 reverses an advancing direction and flips the transfer sheet P in a switch back manner after temporarily stacking the transfer sheet P with the fixed image on the reversal conveyance path 47. Further, the transfer sheet P is conveyed by the first and second double-side conveyance rollers 48 and 49 toward the registration roller 41 through the duplex sheet conveyance path in synchronism with image formation. The registration roller 41 feeds the transfer sheet P to the secondary transfer unit again to transfer an image on a rear side of the transfer sheet P. The transfer sheet P with the image printed on the rear side thereof is subsequently conveyed into the fixing unit 90, and the images are fixed by heat and pressure thereof. The transfer sheet P is then conveyed by the conveyance roller 43 toward the sheet exit unit 24 and is finally ejected by the sheet exit roller 44. By this, a color image can be obtained on both sides of the transfer sheet P.

Residual toner particles on the photoconductive drum 31Y, 31M, 31C, and 31K are removed by the cleaners 36Y, 36C, 36M, and 36K, respectively. Afterward, the charging devices 32Y, 32C, 32M, and 32K, to each of which a DC and AC-components superimposed bias is applied, provide and remove charges simultaneously to and from the photoconductive drums 31Y, 31M, 31C, and 31K to prepare for the next image formation. Further, residual toner on the intermediate transfer belt 37a is also removed by an intermediate transfer belt cleaner 38 to prepare for the next image formation step as well.

Although one exemplary interior of the image forming apparatus is described heretofore, the image forming apparatus according to the present invention is not limited thereto. That is, even though the tandem system employed image formation unit is described as one example in FIG. 2, a color image formation unit with a single photoreceptor, multiple developing devices, and an intermediate transfer member (i.e., a so-called one-drum and intermediate transfer system) is also employable instead. Further, an image formation unit that only forms a monochromatic image is also employable. Further, although the configuration with the scanner unit 25 is described as one example as shown in FIG. 1, a printer can be established if the scanner unit 25 is detached.

Figure 2:
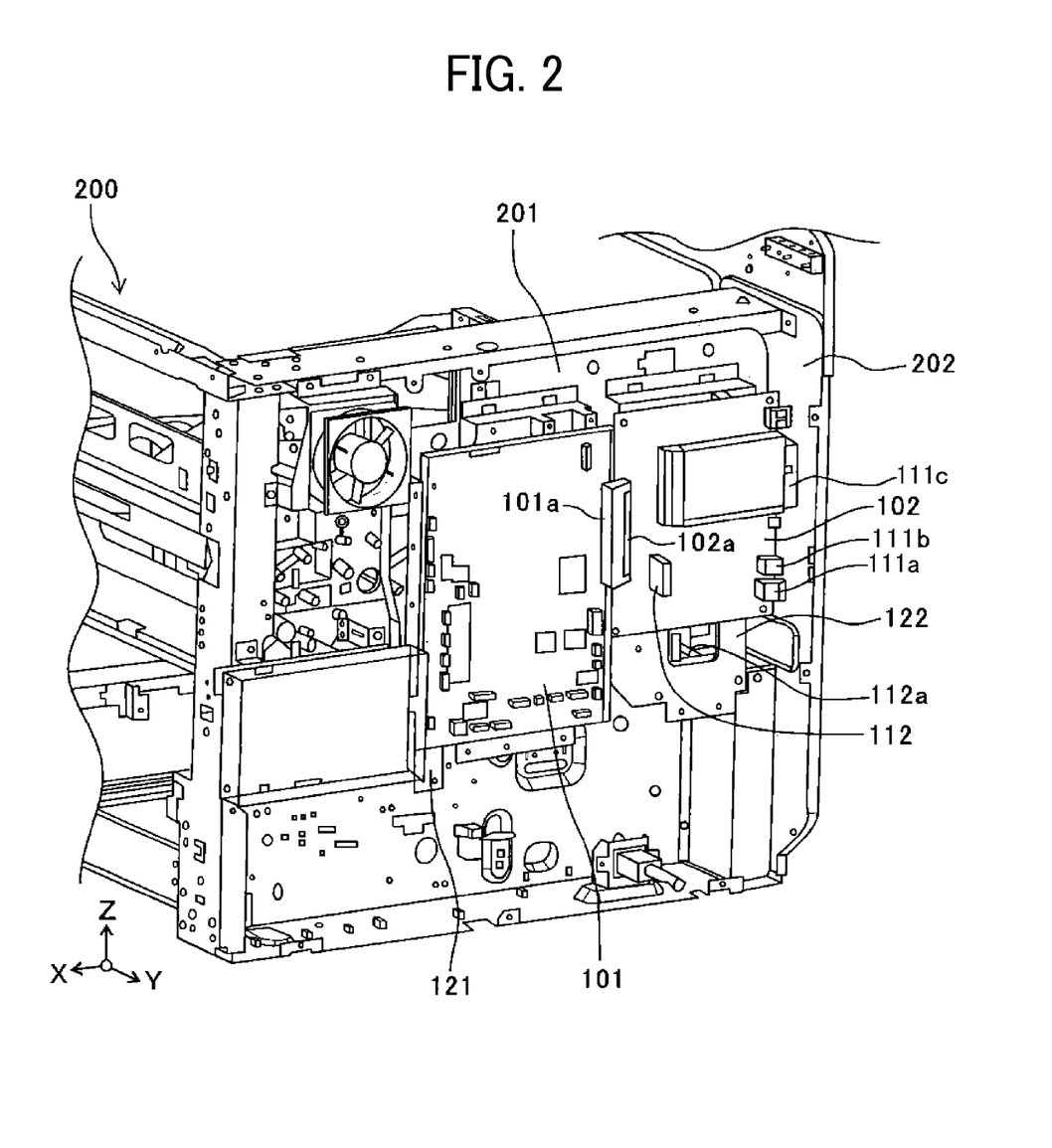
FIG. 2 illustrates a mainframe of the copier and a control board to control the copier according to one embodiment of the present invention.

FIG. 2 is a perspective view illustrating a mainframe 200 of the copier and a control board that controls the copier. As shown in FIG. 2, to a rear side plate 201 made of metal serving as a mount constituting the mainframe 200, a motherboard 101 that generally controls an image forming apparatus is attached as a first board. A control board 102 with multiple external terminals 111a, 111b, and 111c that connects with an external device of the copier is also attached as a second board.

The motherboard 101 is held by a main bracket 121 made of metal attached to the rear side plate 201 as a first bracket. The control board 102 is held by a sub-bracket 122 that is made of metal and attached to the rear side plate 201 as a second bracket. Specifically, the sub-bracket 122 is attached to the rear side plate 201 with each of the external terminals 111a, 111b, and 111c mounted on the control board 102 protruding from the side plate 202 that serves as an orthogonal plane orthogonal to that of the control substrate 102 mounted on the mainframe 200.

On the control board 102, an expansion terminal 112 to connect with an expansion unit, such as HDD etc., that enhances the functionality of an internal device, is mounted. Specifically, the HDD expands image data storage capacity of a prescribed internal device. The expansion unit of the HDD or the like is attachable to an opposite surface (hereinafter referred to as a rear side) of the sub-bracket 102 to a surface onto which the control board 102 is attached. A wiring hole 112a is formed on the sub-bracket 122. Thus, a harness is routed through this wiring hole 112a so that the expansion terminal is connected to the expansion unit attached to the rear side of the sub bracket 122. By holding the expansion unit with sub-bracket 122 holding the control board 102 in this way, a component cost can be more reduced when compared with a mechanism in which brackets to hold the expansion unit and the control board 102 are separately employed.

Further, at one end (i.e., a left side end in the drawing) of the control board 102, which is opposite the other end (i.e., a right side end in the drawing) in which the external terminals 111a, 111b, and 111c are mounted, there is provided a control connector 102a that directly connects with a main connector 102a of the motherboard 101.

Figure 3:
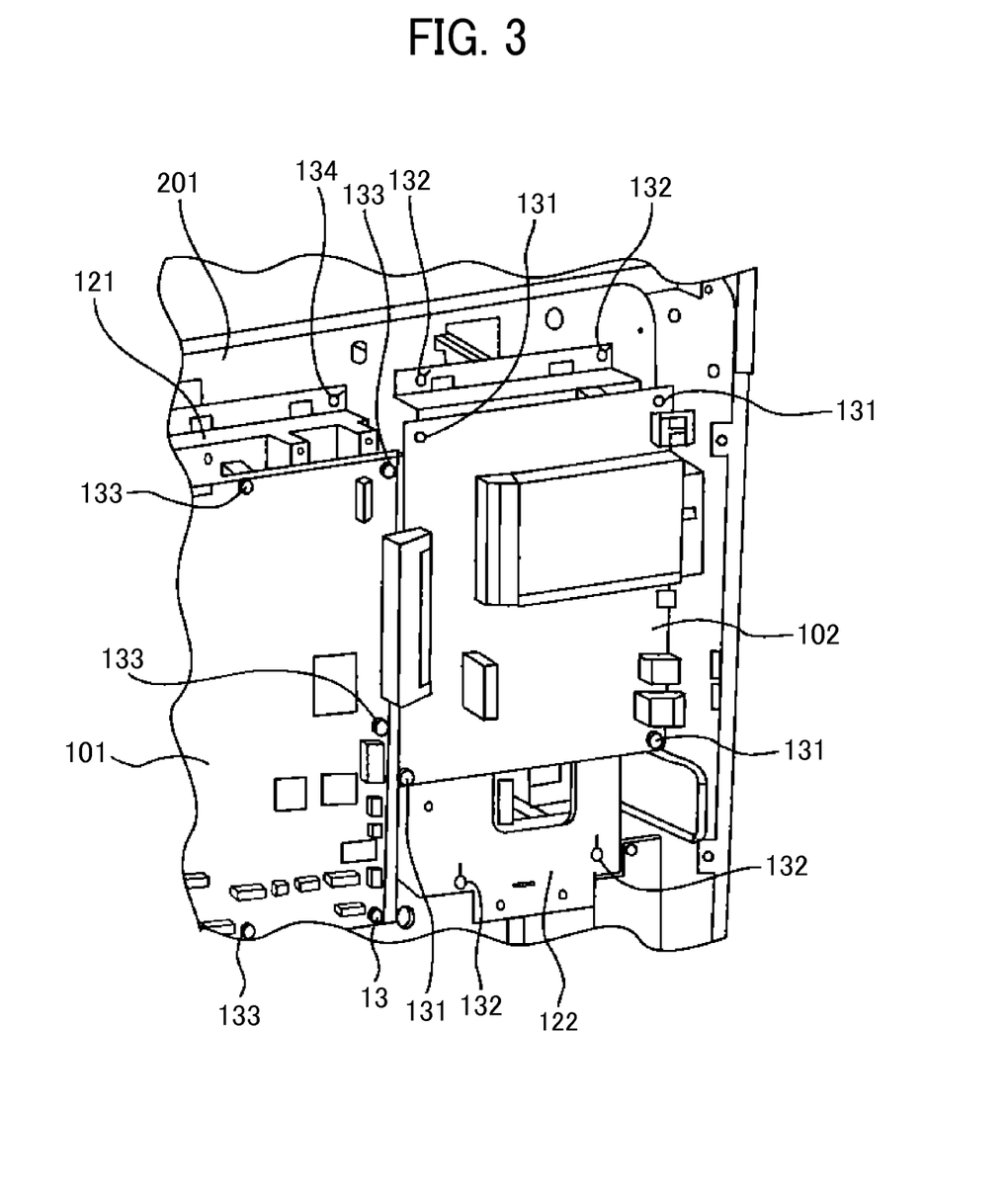
FIG. 3 is an enlarged perspective view illustrating a portion near the control board according to one embodiment of the present invention.

FIG. 3 is an enlarged perspective view illustrating the control board 102 and the vicinity thereof. As shown in FIG. 3, four corners of the control board 102 are attached by screws 131 to the sub-bracket 122, respectively. The sub-bracket 122 is attached to the rear side plate 201 by multiple screws 132, respectively. In this way, by screwing the metal sub-bracket 122 with the control board 102 fixed thereto to the metal rear side plate 201, the metal sub-bracket 122 can precisely engage the rear side plate 201. Thus, electrical connection between the sub-bracket 122 and the rear side plate 201, and accordingly grounding of the control board 102 can be ensured.

Further, the motherboard 101 is also attached by multiple screws 133 to the main bracket 121 made of metal, while the metal main bracket 121 is attached to the rear side plate 201 with multiple screws 134. By this, the main bracket 121 can also precisely engage the rear side plate 201 and electrical grounding of the motherboard 101 can be also ensured.

Figure 4:
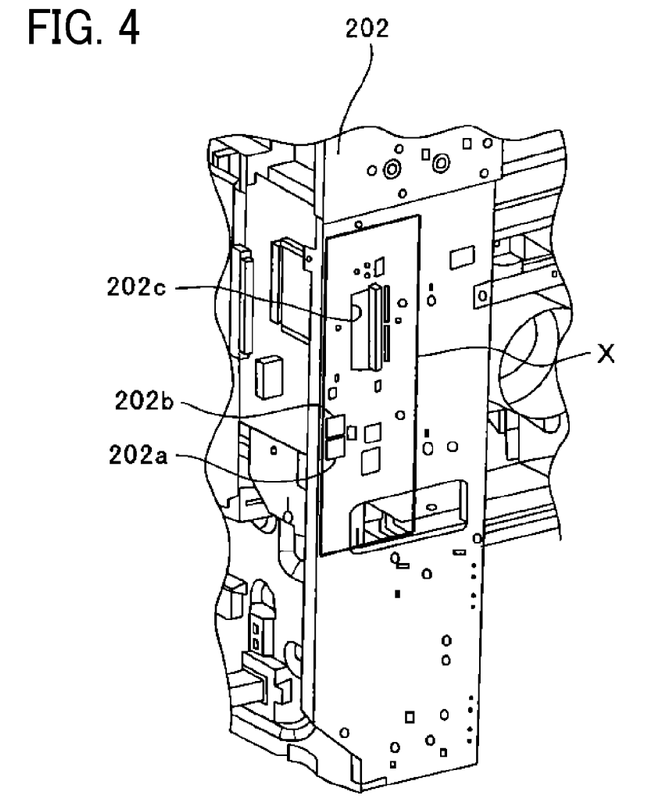
FIG. 4 is an enlarged perspective view illustrating a side plate according to one embodiment of the present invention.

FIG. 4 is a perspective view showing the side plate 202 exposing the external terminals 111a, 111b, and 111c mounted on the control board 102. As shown in FIG. 4, on the side plate 202, there are provided first to third openings 202a, 202b, and 202c to expose the first, second, and third external terminals 111a, 111b, and 111c mounted on the control substrate 102, respectively. A solid line X in the drawing indicates an opening formed on the side plate 202 when the control board 202 is configured to be removed and practically removed from the side plate 202.

Figure 5:
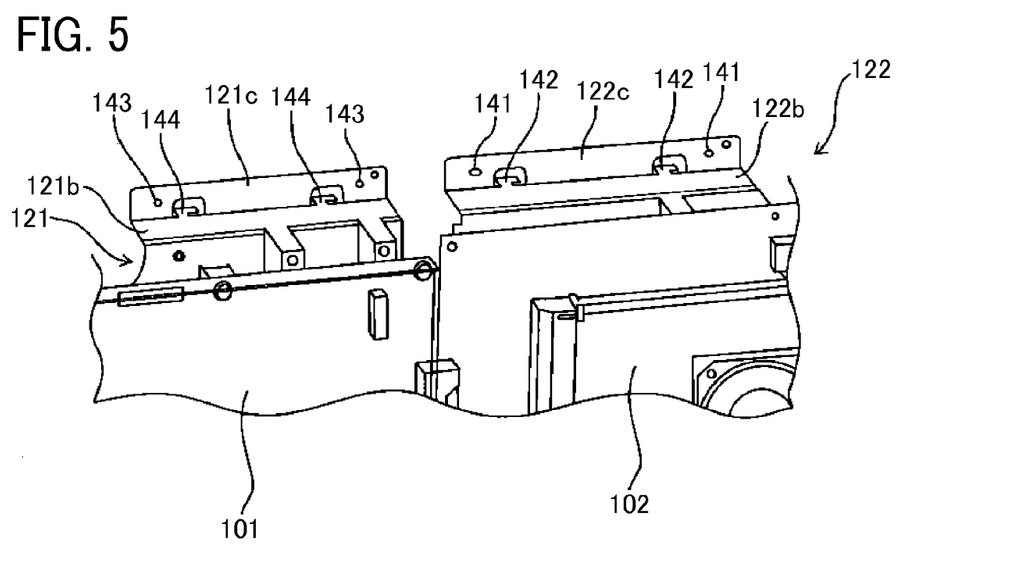
FIG. 5 is a perspective view illustrating respective essential portions of a main bracket and a sub-bracket according to one embodiment of the present invention.

FIG. 5 is a perspective view showing an essential portion of the main and sub brackets 121 and 122. The sub-bracket 122 is formed from a metal plate including a first bent portion 122b receiving a bending process near its upper end to be bent toward the rear side plate 201, and a second bent portion 122c receiving the bending process at its tip to be bent in parallel to the rear side plate 201. At left and right side ends of the second bent portion 122c in the drawing, multiple screw insertion holes 141 are formed to receive insertion of the screws 132 as illustrated back in FIG. 4. Further, at prescribed positions more adjacent to a center than these screw insertion holes 141, a pair of guiding projections 142 protruding to the rear side plate 201 from the second bent portion 122c is provided at a prescribed interval.

The main bracket 121 has almost a similar configuration as the sub-bracket 122. Specifically, the main-bracket 121 is also formed from a metal plate including a first bent portion 121b receiving a bending process near its upper end to be bent toward the rear side plate 201, and a second bent portion 121c receiving the bending process at its tip to be bent in parallel to the rear side plate 201. At left and right side ends of the second bent portion 121c in the drawing, multiple screw insertion holes 143 are formed to receive insertion of the screws 133 as illustrated back in FIG. 4. Further, multiple projections 142 protruding toward the rear side plate 201 from the second bent portion 122c are also provided at a prescribed interval.

Figure 6:
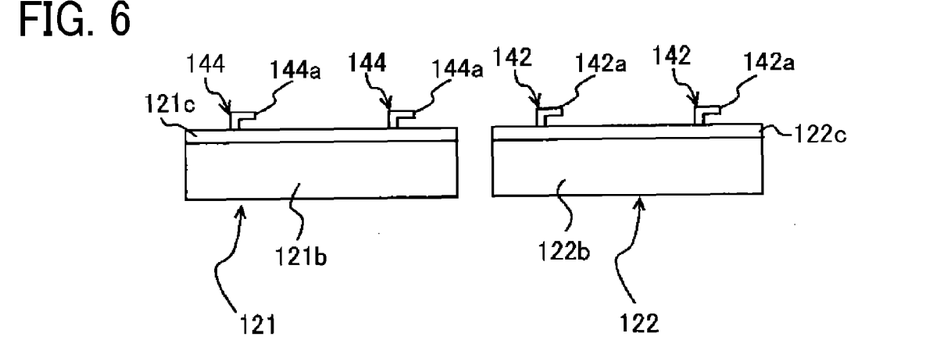
FIG. 6 is a schematic plan view of the main bracket and the sub-bracket when viewed from the above.

FIG. 6 is a plan view schematically illustrating the main and sub brackets 121 and 122. As shown in the drawing, multiple hooks 142a and 144a extending toward and facing the side plate 202 are disposed at tips of the guiding projections 144 and 142 provided on the brackets 121 and 122, respectively.

Figure 7:
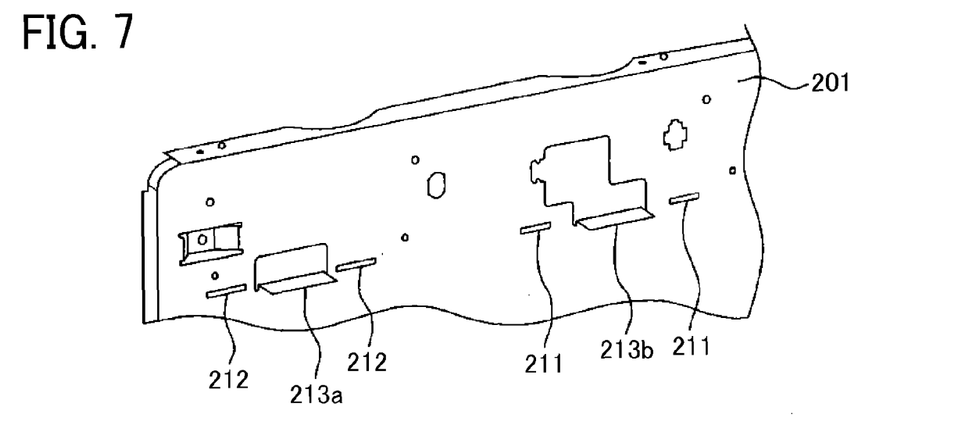
FIG. 7 is a perspective view illustrating an essential portion of a rear side plate according to one embodiment of the present invention.

FIG. 7 is a perspective view showing an essential portion of the rear side plate 201. As shown in FIG. 7, two pairs of guiding holes 211 and 212 are formed on the rear side plate 201 extending toward the side plate 202 at its positions opposed to the guiding projections 142 and 144 of the sub and main brackets 122 and 121, respectively. Accordingly, the guiding projections 142 and 144 of the brackets 121 and 122 are inserted into the corresponding guiding holes 211 and 212, respectively. Further, between the two guiding holes 211 into which the guiding projections 142 of the sub-bracket 122 are inserted, respectively, a sub-guide supporting surface 213b folded toward the control board 102 is provided. As described later in detail, the first bending portion 122b of the sub-bracket 122 is mounted and supported by the sub-guide support surface 213b until the sub-bracket 122 has been attached to the rear side plate 201 with a screw.

Similarly, between the two guiding holes 212 into which the guiding projections 144 of the main bracket 121 are inserted, respectively, a main-guide supporting surface 213a folded toward the motherboard 101 is provided. Accordingly, the first bending portion 121b of the main bracket 121 is mounted and supported by the main-guide support surface 213a until the motherboard 101 (i.e., the main bracket 121) has been attached to the rear side plate 201 with the screw.

Figure 8:
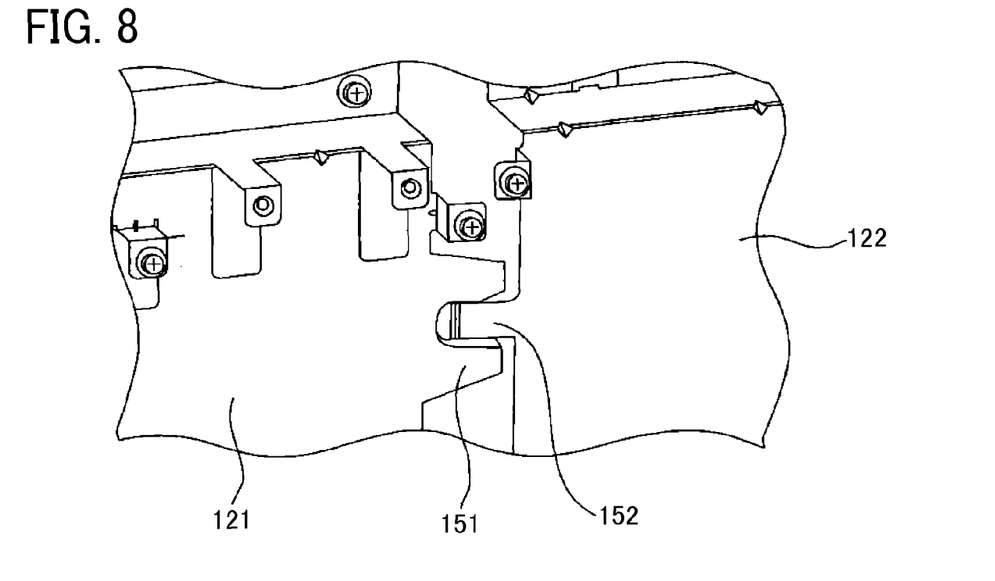
FIG. 8 is a perspective view illustrating respective portions almost opposed to connectors of the main bracket and the sub-bracket.

FIG. 8 is a perspective view illustrating portions of the main and sub brackets 121 and 122 opposed to the respective connectors 101a and 102a. As shown in FIG. 8, a first concave connector guide 151 is provided at a prescribed position of the main bracket 121 opposed to the connector 101a of the motherboard 101. Whereas, a second convex connector guide 152 is provided at a prescribed position of the sub-bracket 122 opposed to the connector 102a of the control board 102. The tip of the first connector guide 151 protrudes from the connector 101a of the motherboard 101 toward the control board 102. Further, a tip of the second connector guide 152 protrudes than that of the connector 102a of the control board 102 toward the motherboard 101.

With such a configuration, when the main connector 101a is inserted into the control connector 102a, the tip of the second connector guide 152 enters a recess of the first connector guide 151 before the main connector 101a engages the control connector 102a. Thus, the main connector 101a moves being guided by the first and second connector guides 151 and 152 in a prescribed direction to precisely connect the main connector 101a with the control connector 102a.

Figure 9A:
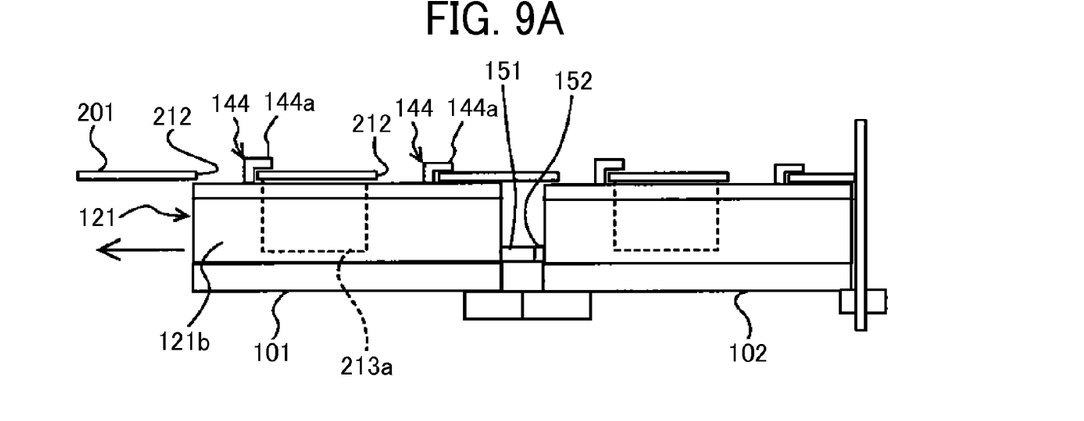
FIGS. 9A, 9B, and 9C are schematic diagrams illustrating removal of the sub-bracket from the mainframe of the image forming apparatus according to one embodiment of the present invention.
Figure 9B:
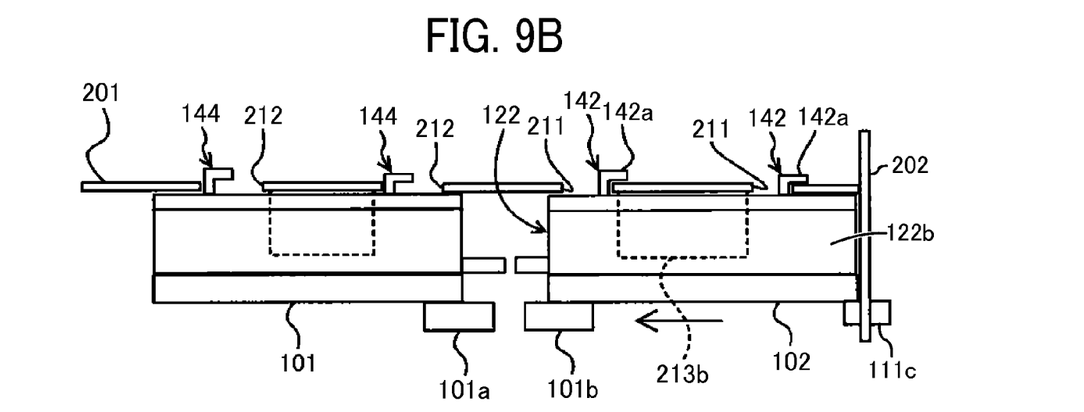
Figure 9C:
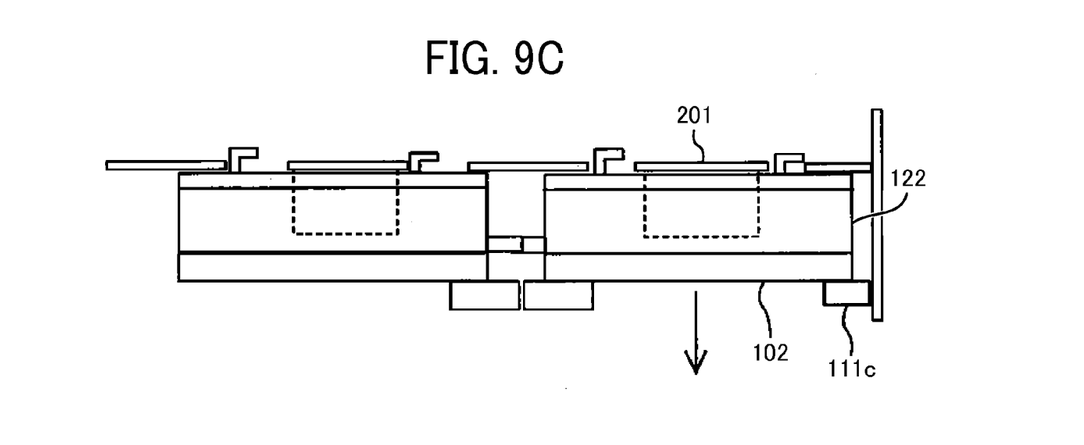
Figure 10:
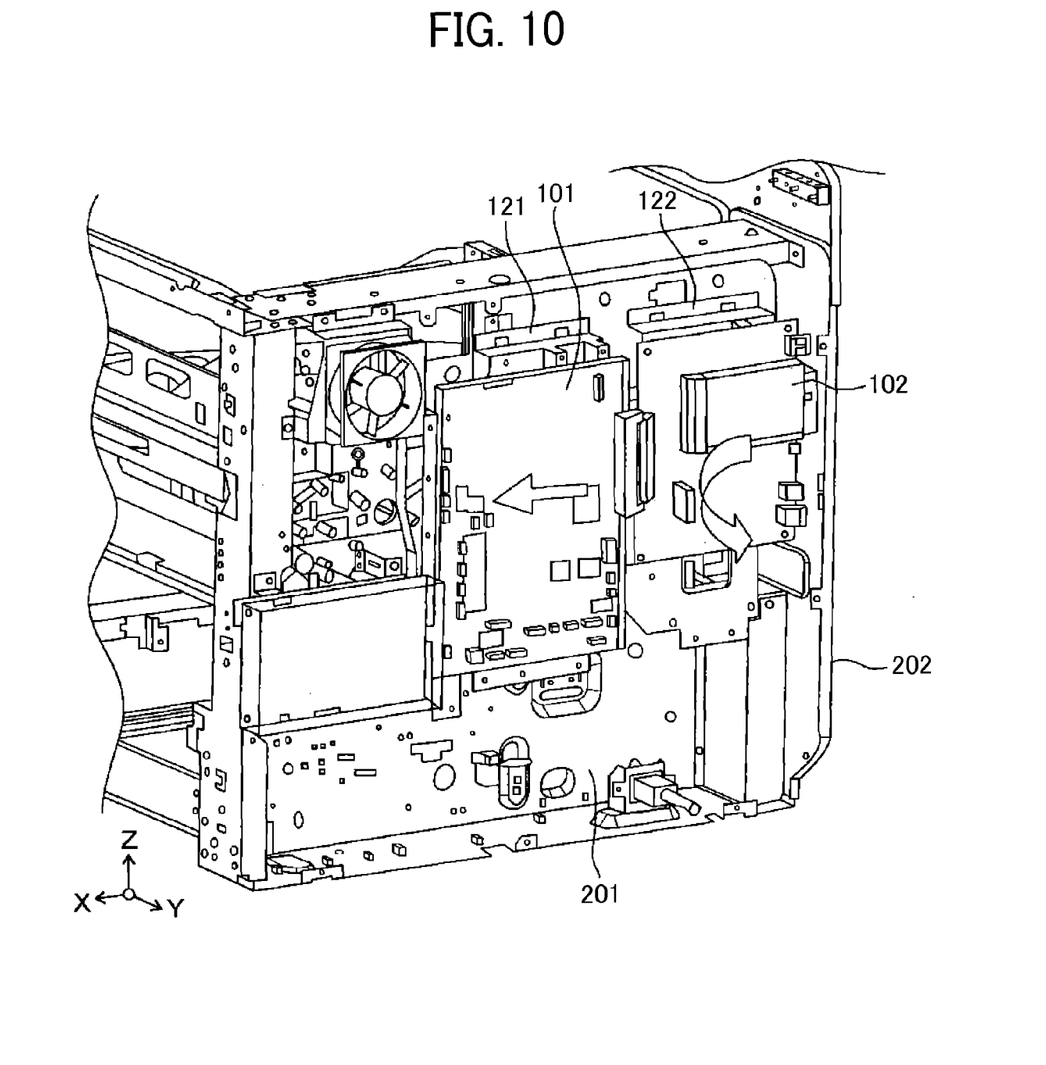
FIG. 10 is a perspective view illustrating the aspect when the sub-bracket is removed from the mainframe of the image forming apparatus.

When additionally attaching a expansion unit, such as a HDD, etc., to the rear side of the sub-bracket 122, the sub-bracket 122 holding the control board 102 needs to be removed from the rear side plate 201 as illustrated in FIGS. 9A to 10.

Specifically, when adding the expansion unit of the HDD or the like, an exterior cover (not shown) of the copier is removed, and the control board 102 and the motherboard 101 attached to the rear side plate 201 are then exposed outside. Then, the screws 134 (see FIG. 3) are removed, and the main bracket 121 and the rear side plate 201 are unscrewed to each other.

At this moment, as shown in FIG. 9A, the hook portions 144a of the guiding projection 144 of the main bracket 121 are caught by (or hang on) an opposite side of the rear side plate 201 to a side holding the parts-mounted board, and the first bent portion 122b of the main bracket 121 is supported by the main guide supporting surface 213a. Hence, even when the screws 134 are removed, the main bracket 121 is inhibited to fall down.

When the main bracket 121 and the rear side plate 201 are unscrewed, the main bracket 121 (i.e., the motherboard 101) is slid in a direction (shown by arrow in FIG. 9A) to separate from the control board 102. Hence, the main connector 101a and the control connector 102a are disconnected from each other as shown in FIG. 10. At this moment, the convex second connector guide 152 of the sub-bracket 122 is guided by the concave first connector guide 151 of the main bracket, and the guiding projection 144 of the main bracket 121 is guided by the guiding hole 212. Accordingly, the main bracket 121 (i.e., the motherboard 101) can be moved in a direction to detach or attach the main connector 101a. Hence, the main connector 101a can be easily extracted from the control connector 102a.

Further, as shown in FIG. 9B, the guiding projection 144 of the motherboard 101 bumps against a left side end of the guiding hole 212 (i.e., an end opposite the control board 102) to prohibit the main bracket 121 (i.e., the motherboard 101) to move in the connector attaching and detaching direction. Hence, the main bracket 121 (i.e., the motherboard 101) is inhibited to excessively move and thereby colliding and damaging internal parts.

Further, when the guiding projection 144 of the motherboard 101 bumps against the left side end of the guiding hole 212 (an end opposite the control board 102), and connection between the connector 101a of the motherboard 101 and the connector 102a of the control board 102 is cancelled as shown in FIG. 9B, the screws 132 (see FIG. 3) are removed so that the sub-bracket 122 and the rear side plate 201 are unscrewed to each other. At this moment, since the hooks 142a of the guiding projection 142 of the sub-bracket 122 are caught by (or hang on) an opposite side of the rear side plate 201 to a side holding the parts-mounted board, and the first bending portion 122b of the sub-bracket 122 is supported on the sub-guide supporting surface 213b, the sub-bracket 122 is prevented from falling down even when the screws 134 are removed.

When the sub-bracket and the rear side plate 201 are unscrewed to each other, the sub-bracket 122 (i.e., the control board 102) is slid closer to the motherboard 101 as shown by arrow in FIG. 9B. At this moment, since the guiding projection 142 of the sub-bracket 122 is guided by the guiding holes 211, the sub-bracket 122 (i.e., the control board 102) can be moved perpendicular to the side plate 202. Hence, the external terminals 111a, 111b, and 111c protruding from the side plate 202 can be smoothly moved and drawn into an interior from the side plate 202. Further, at this moment, the guiding projection 142 of the control board 102 bumps against the left end of the guiding hole 211 in the drawing (i.e., an end on the side of the motherboard) to prohibit the sub-bracket 122 (i.e., the control board 102) from moving. Hence, the sub-bracket 122 (i.e., the control board 102) is inhibited to excessively move and thereby colliding and damaging the motherboard 101 or the like.

Specifically, as shown in FIG. 9C, the external terminals 111a, 111b, 111c are drawn into the interior from the side plate 202 via the external terminal openings 202a, 202b, and 202c on the side plate 202, respectively. Hence, by moving the sub-bracket 122 (i.e., the control board 102) away from the rear side plate 201 in this way, the sub-bracket 122 holding the control board 102 can be removed while prohibiting the external terminals 111a, 111b, and 111c from bumping against the external terminal openings 202a, 202b, and 202c, respectively.

Subsequently, the expansion unit of the HDD or the like is attached to the rear side of the sub-bracket 122 (i.e., the opposite side to a side holding the control board 102) currently removed from the image forming apparatus with the control board 102, and the harness is routed through the wiring hole of the sub-bracket 122 to connect the expansion unit with the expansion terminal 112 mounted on the control board 102. The sub-bracket 122 holding the control board 102 to which the expansion unit is thus attached is installed into the mainframe of the image forming apparatus in a procedure reverse to the above-described detaching manner. Specifically, the guiding protrusions 142 of the sub-bracket 122 are inserted into the guiding holes 211 to move the sub-bracket 122 toward the side plate 202. When the external terminals 111a, 111b, and 111c of the control board 102 protrude from the side plate 202 and the guiding projections 142 bumps against the right side ends of the guiding holes 211 (i.e., ends on the side of the side plate 202) in the drawing, the sub-bracket 122 is attached to the rear side plate 201 with a screw. At this moment, the hook portion 142a is caught by (or hang on) the opposite side of the rear side plate 201 to the side holding the parts-mounted board, and the sub-bracket 122 is supported on the sub-guide supporting surface 213b. Therefore, the sub-bracket 122 can easily be attached with the screws without falling down during its securing operation therewith.

Hence, when the sub-bracket 122 is attached to the rear side plate 201 with the screw, the main bracket 121 is moved toward the control board 102. When the main bracket 121 is moved toward the control board 102, the tip of the convex second connector guide 152 fits into the recess of the first connector guide 151. Thus, the main connector 101a is guided to the first and second connector guides 151 and 152, and is finally connected to the control connector 102a. Subsequently, the main bracket 121 is also attached to the rear side plate 201 with the screw. Again, at this moment, since the hook portions 144a are caught by (or hang on) the opposite side of the rear side plate 201 to the side holding the parts-mounted board while the main bracket 121 is supported on the main guide supporting surface 213a, the main bracket 121 can easily be attached without falling down during its securing operation with the screws.

Thus, in this embodiment, since the sub-bracket 122 holding the control board 102 can be taken out perpendicular to the surface of the parts-mounted board, at least openings need to be formed on the side plate 202 to expose the external terminals 111a, 111b, and 111c of the control board 102. As a result, rigidity of the mainframe 200 can be maintained suppressing vibration thereof generally caused by vibration of an actuator which drives the photoconductive drum 31 or the like. Furthermore, since the member covering the opening is no longer needed on the sub-bracket 122 unlike the conventional apparatus, increase in the number of components can be suppressed reducing a device cost.

Further, a length of each of the guiding holes 211a and 211b, in which each of the guiding projections 142 of the sub-bracket 122 is inserted and moved, is preferably set to the minimum level capable of drawing the external terminals 111a, 111b, and 111c inside the side plate 202 from the external terminal openings 202a, 202b and 202c on the side plate 202, respectively. With this, immediately when the external terminals 111a, 111b, and 111c enter the interior of the image forming apparatus from the external terminal openings 202a and 202b on the side plate 202, the guiding projections 142 bump against the ends of the guiding holes 211 on the side of the motherboard 101, respectively. Hence, necessity of movement of the sub-bracket 122 toward the motherboard can be minimized. Further, each of the guiding holes 212a, in which each of the guiding projections 144 of the main bracket 121 is inserted and moved, desirably has a minimum necessity length capable of avoiding the connectors from contacting each other when the sub-bracket is moved toward the main circuit parts-mounted board 101. Specifically, the length of each of the guiding holes 212a is determined and set as the sum of a minimum length needed to disconnect the connectors from each other and a minimum length needed for the sub-bracket 122 to detach the external terminals 111a, 111b, and 111c from the respective openings 202a, 202b and 202c of the side plate 202. Hence, the main bracket 121 can be inhibited to move unnecessarily.

In the above-described embodiment, after sliding the motherboard 101, and disconnecting the main connector 101a and the control connector 102a from each other, the control board 102 is slid. However, the present invention is not limited thereto, and the connectors 101a and 102a can be disengaged from each other after both the motherboard 101 and the control board 102 are integrally slid drawing the external terminals into the image forming apparatus.

According to one embodiment, a parts-mounted board structure includes a first board having a first connector and a second board having a second connector and an external terminal connectable to an external device. The second board is electrically connected to the first board by directly inserting the second connector into the first connector. A mounting board, to which the first and second boards are attached, is provided. The second board is attached to the mounting board with the external terminal protruding from an external terminal insertion opening formed on an orthogonal surface of the mainframe of the image forming apparatus orthogonal to a surface of the second board. The external terminal is inserted into (or extracted from) the external terminal insertion opening. The first and second boards are slidably attached in a prescribed direction to separate from the orthogonal surface of the mainframe of the image forming apparatus.

Specifically, a first board at least includes a first connector. A second board has a second connector electrically connected directly to the first connector of the first board. The second board includes an external terminal connectable to an external device. The external terminal is inserted through an external terminal insertion opening formed on an orthogonal surface of a mainframe orthogonal to a surface of the second board. A mounting board is provided and to which the first and second boards are attached. The second board is attached to the mounting board with the external terminal protruding from the external terminal insertion opening. The first and second boards are slidably attached in a prescribed direction to separate from the orthogonal surface of the mainframe.

With such a configuration, a second board can be removed from the mainframe of the image forming apparatus without an opening in a surface to extract the second board. This can avoid weakening of the mainframe 200. Further, a member to block the opening in the side plate 202 is no longer needed, thereby capable of promoting cost reduction of the device.

According to another embodiment, a first bracket is provided to hold the first board, and a second bracket is provided to hold the second board. A first guiding hole is formed on one of the first bracket and the mounting board to extend perpendicular to the orthogonal surface of the mainframe of the image forming apparatus. A first guiding projection is formed on the other one of the first bracket and the mounting board to be inserted into the first guiding hole. A second guiding hole is formed on one of the second bracket and the mounting board to extend perpendicular to the orthogonal surface of the mainframe of the image forming apparatus. A second guiding projection is also formed on the other one of the second bracket and the mounting board to be inserted into the second guiding hole. With such a configuration, the first and second boards can be slid apart from an orthogonal surface section of the above-described apparatus mainframe 200.

According to yet another embodiment, the mounting board is a plate like member extending perpendicular to a horizontal plane. A hook is disposed on a tip of the guiding projection extending perpendicular to the orthogonal surface of the mainframe of the image forming apparatus to hook onto the mounting board. With such a configuration, the guiding projections 142 and 144 can be prohibited from deviating out of the guiding holes 211 and 212, and the first and second brackets can be prohibited from falling from the above-described mounting board.

According to yet another embodiment, the second board includes an expansion terminal connected to an expansion unit to enhance the functionality of an internal device. The second bracket includes an expansion unit mounting section, to which the expansion unit is attached. With such a configuration, a component cost can be reduced more effectively than a configuration in which a bracket to hold the expansion unit and a bracket to hold the second board are separately arranged.

According to yet another embodiment, a connector guide is provided to guide the first connector of the first board to the second connector of the second board when the first connector of the first board is connected to the second connector of the second board. With such a configuration, the connector 101a of the first board can be readily inserted into the connector 102a of the second board.

According to yet another embodiment, the connector guide guides the first connector of the first board to the second connector of the second board before the first connector of the first board contacts the second connector of the second board. With such a configuration, the connector 101a of the first board can be accurately guided easily to the connector 102a of the second board.

According to yet another embodiment, the second board is attached to the mounting board with the screw. With such a configuration, contact with the mounting board can be reliable and electrical grounding of the second board can be ensured.

According to yet another embodiment, an image forming apparatus includes an image forming apparatus to form an image on a recording medium, and the above-described parts-mounted board with multiple substrates mounted thereon. With such a configuration, weakening of the mainframe 200 can be suppressed reducing vibration thereof. As a result, an image is not distorted due to vibration of the photoreceptor or the like.

Numerous additional modifications and variations of the present invention are possible in light of the above teachings. It is therefore to be understood that within the scope of the appended claims, the present invention may be practiced otherwise than as specifically described herein.

What is claimed is:

1. A motherboard mounting structure comprising:
    a first board at least having a first connector;
    a second board having a second connector electrically connected directly to the first connector of the first board, the second board including an external terminal connectable to an external device, the external terminal being inserted through an external terminal insertion opening formed on an orthogonal surface of a mainframe orthogonal to a surface of the second board;
    a mount to which the first and second boards are attached;
    a first bracket to hold the first board;
    a second bracket to hold the second board;
    a first guiding hole formed on one of the first bracket and the mount, the guiding hole extending perpendicular to the orthogonal surface of the mainframe;
    a first guiding projection formed on the other one of the first bracket and the mount to be inserted into the first guiding hole;
    a second guiding hole formed on one of the second bracket and the mount, the guiding hole extending perpendicular to the orthogonal surface of the mainframe; and
    a second guiding projection formed on the other one of the second bracket and the mount to be inserted into the second guiding hole, wherein
        the second board is attached to the mount with the external terminal protruding from the external terminal insertion opening, and
        the first and second boards are slidably attached in a prescribed direction to separate from the orthogonal surface of the mainframe.

2. The motherboard mounting structure as claimed in claim 1, further comprising:
    a connector guide to guide the first connector of the first board to the second connector of the second board when the first connector of the first board is connected to the second connector of the second board.

3. The motherboard mounting structure as claimed in claim 1, wherein the second board is attached to the mount with a screw.

4. The motherboard mounting structure as claimed in claim 1, wherein the mount is a plate member extending perpendicular to a horizontal plane, and the motherboard mounting structure further comprises:
    a hook disposed on a tip of the guiding projection extending perpendicular to the orthogonal surface of the mainframe to hook onto the mount.

5. The motherboard mounting structure as claimed in claim 4, wherein the second board includes an expansion terminal connected to an expansion unit to enhance the functionality of an internal device provided inside the mainframe, wherein the second bracket includes an expansion unit-mount, to which the expansion unit is attached.

6. The motherboard mounting structure as claimed in claim 4, wherein the connector guide guides the first connector of the first board to the second connector of the second board before the first connector of the first board contacts the second connector of the second board.

7. An image forming apparatus comprising:
    an image formation device to form an image on a recording medium; and
    at least one motherboard mounting structure including,
        a first board at least having a first connector,
        a second board having a second connector electrically connected directly to the first connector of the first board, the second board including an external terminal connectable to an external device, the external terminal being inserted through an external terminal insertion opening formed on an orthogonal surface of a mainframe orthogonal to a surface of the second board,
        a mount to which the first and second boards are attached,
        a first bracket to hold the first board,
        a second bracket to hold the second board,
        a first guiding hole formed on one of the first bracket and the mount, the guiding hole extending perpendicular to the orthogonal surface of the mainframe,
        a first guiding projection formed on the other one of the first bracket and the mount to be inserted into the first guiding hole,
        a second guiding hole formed on one of the second bracket and the mount, the guiding hole extending perpendicular to the orthogonal surface of the mainframe, and
        a second guiding projection formed on the other one of the second bracket and the mount to be inserted into the second guiding hole, wherein
            the second board is attached to the mount with the external terminal protruding from the external terminal insertion opening, and
            the first and second boards are slidably attached in a prescribed direction to separate from the orthogonal surface of the mainframe.

8. The image forming apparatus as claimed in claim 7, further comprising:
    a connector guide to guide the first connector of the first board to the second connector of the second board when the first connector of the first board is connected to the second connector of the second board.

9. The image forming apparatus as claimed in claim 7, wherein the second board is attached to the mount with a screw.

10. The image forming apparatus as claimed in claim 7, wherein the mount is a plate member extending perpendicular to a horizontal plane, further comprising a hook disposed on a tip of the guiding projection extending perpendicular to the orthogonal surface of the mainframe to hook onto the mount.

11. The image forming apparatus parts-mounted board structure as claimed in claim 10, wherein the second board includes an expansion terminal connected to an expansion unit to enhance the functionality of an internal device provided inside the mainframe, wherein the second bracket includes an expansion unit mount, to which the expansion unit is attached.

12. The image forming apparatus as claimed in claim 10, wherein the connector guide guides the first connector of the first board to the second connector of the second board before the first connector of the first board contacts the second connector of the second board.

13. A method for detaching a first board at least having a first connector and a second board having a second connector electrically connected directly to the first connector of the first board from a mount provided in a motherboard mounting structure to which the first and second boards are attached,
the second board including an external terminal connectable to an external device, the external terminal being inserted through an external terminal insertion opening formed on an orthogonal surface of a mainframe orthogonal to a surface of the second board, the second board being attached to the mount with the external terminal protruding from the external terminal insertion opening,
the motherboard mounting structure including a first bracket to hold the first board, a second bracket to hold the second board, a first guiding hole formed on one of the first bracket and the mount, the guiding hole extending perpendicular to the orthogonal surface of the mainframe, a first guiding projection formed on the other one of the first bracket and the mount to be inserted into the first guiding hole, a second guiding hole formed on one of the second bracket and the mount, the guiding hole extending perpendicular to the orthogonal surface of the mainframe, and a second guiding projection formed on the other one of the second bracket and the mount to be inserted into the second guiding hole, the method comprising:
opening a front cover at the front;
exposing the first and second boards;
sliding the first and second boards in a direction perpendicular to the orthogonal surface of the mainframe to separate those therefrom; and
detaching one of the first and second boards at the front.

14. The method as claimed in claim 13, wherein the motherboard mounting structure further includes a connector guide to guide the first connector of the first board to the second connector of the second board when the first connector of the first board is connected to the second connector of the second board.

15. The method as claimed in claim 13, wherein the second board is attached to the mount with a screw.

16. The method as claimed in claim 13,
wherein the mount is a plate member extending perpendicular to a horizontal plane,
wherein the motherboard mounting structure further includes a hook disposed on a tip of the guiding projection extending perpendicular to the orthogonal surface of the mainframe to hook onto the mount.

17. The method as claimed in claim 13,
wherein the second board includes an expansion terminal connected to an expansion unit to enhance the functionality of an internal device provided inside the mainframe,
wherein the second bracket includes an expansion unit-mount, to which the expansion unit is attached.

* * * * *